United States Patent
Unno

(10) Patent No.: US 6,327,086 B1
(45) Date of Patent: Dec. 4, 2001

(54) OPTICAL DIFFRACTION DEVICE AND EXPOSURE APPARATUS

(75) Inventor: Yasuyuki Unno, Minamikawachi-machi (JP)

(73) Assignee: Canon Kabushiki Kaisha, Tokyo (JP)

(*) Notice: Subject to any disclaimer, the term of this patent is extended or adjusted under 35 U.S.C. 154(b) by 0 days.

(21) Appl. No.: 09/359,044

(22) Filed: Jul. 23, 1999

Related U.S. Application Data

(62) Division of application No. 08/889,859, filed on Jul. 8, 1997, now Pat. No. 5,995,285.

(30) Foreign Application Priority Data

Jul. 9, 1996 (JP) .................................................... 8-179077
Jul. 9, 1996 (JP) .................................................... 8-179082

(51) Int. Cl.$^7$ .............................. G02B 5/18; G02B 27/44
(52) U.S. Cl. .......................... 359/565; 359/566; 359/569
(58) Field of Search ................................... 359/565, 566, 359/568, 581, 558, 569

(56) References Cited

U.S. PATENT DOCUMENTS

| 4,936,665 | | 6/1990 | Whitney | 359/565 |
|---|---|---|---|---|
| 5,007,708 | * | 4/1991 | Gaylord et al. | 359/566 |
| 5,119,231 | | 6/1992 | Nelson et al. | 359/359 |
| 5,472,811 | | 12/1995 | Vasudev et al. | 430/5 |
| 5,496,616 | * | 3/1996 | Harris | 359/569 |
| 5,543,966 | | 8/1996 | Meyers | 359/565 |
| 5,629,074 | * | 5/1997 | Klocek et al. | 359/356 |
| 5,629,799 | | 5/1997 | Maruyama et al. | 359/565 |
| 5,629,804 | | 5/1997 | Tomono | 359/576 |
| 5,694,247 | * | 12/1997 | Ophey et al. | 359/569 |
| 5,696,584 | * | 12/1997 | Franz et al. | 359/569 |
| 5,726,805 | * | 3/1998 | Kaushik et al. | 359/568 |
| 5,734,502 | | 3/1998 | Ebstein | 359/569 |
| 5,754,340 | | 5/1998 | Ushida et al. | 359/566 |
| 5,774,278 | * | 6/1998 | Kaplan | 359/599 |
| 5,817,396 | * | 10/1998 | Perlo et al. | 359/885 |
| 5,829,856 | * | 11/1998 | Perlo et al. | 353/84 |
| 5,839,807 | * | 11/1998 | Perlo | 353/38 |
| 5,973,827 | * | 10/1999 | Chipper | 359/356 |

FOREIGN PATENT DOCUMENTS

| 0390610A2 | * | 10/1990 | (EP) . | |
|---|---|---|---|---|
| 58-174906 | | 10/1983 | (JP) . | |
| A 0237401 | * | 10/1987 | (JP) | 359/581 |

OTHER PUBLICATIONS

M.E. Motamedi, et al., "Antireflection Surfaces in Silicon Using Binary Optics Technology", Applied Optics, vol. 31, No. 22, pp. 4371–4376, Aug. 1992.*

(List continued on next page.)

Primary Examiner—Darren Schuberg
Assistant Examiner—John Juba, Jr.
(74) Attorney, Agent, or Firm—Fitzpatrick, Cella, Harper & Scinto

(57) ABSTRACT

A binary-type optical diffraction device having the excellent capability of antireflection includes a step structure by which lens elements of a Fresnel lens are approximated. The surface of the steps formed on a substrate is entirely covered with a thin film having a flat surface. The height of each step and the refractive index of the thin film are selected so that the antireflection conditions for the respective steps are satisfied and thus the intensity of the reflected light rays is minimized.

40 Claims, 18 Drawing Sheets

OTHER PUBLICATIONS

T.K. Gaylord, et al., "Zero–Reflectivity High Spatial Frequency Rectangular–Groove Dielectric Surface–Relief Gratings", Applied Optics, vol. 25, No. 24, pp. 4562–4567, Dec. 1986.*

R.C. Enger, et al., "Optical Elements with Ultrahigh Spatial–Frequency Surface Corrugations", Applied Optics, vol. 22, No. 20, pp. 3220–3228, Oct. 1983.*

Pawlowski, E., et al., "Antireflection–Coated Diffractive Optical Elements Fabricated By Thin–Film Deposition", Optical Engineering vol. 33, No. 11, pp. 3537–3546 (Nov. 1994).

Farn, M.W., et al., Chapter 8: "Binary Optics" in *Handbook of Optics*, Second Edition, vol. 11, pp. 8.1–8.19 (1995).

Swanson, G.J., "Binary Optics Technology: The Theory and Design of Multi–Level Diffractive Optical Elements", Massachusetts Institute of Technology Lincoln Laboratory Technical Report 854, pp. 1–44 (Aug. 1989).

Swanson, G.J., "Binary Optics Technology: Theoretical Limits in the Diffraction Efficiency of Multilevel Diffractive Optical Elements", Massachusetts Institute of Technology Lincoln Laboratory Technical Report 914, pp. 1–27 (Mar. 1991).

* cited by examiner

FLOW OF SEMICONDUCTOR DEVICE PRODUCTION PROCESS

WAFER PROCESS

OPTICAL DIFFRACTION DEVICE AND EXPOSURE APPARATUS

This is a divisional application of Application Ser. No. 08/889,859, filed Jul. 8, 1997 now U.S. Pat. No. 5,995,285.

BACKGROUND OF THE INVENTION

1. Field of the Invention

The present invention relates to an optical diffraction device, and more particularly to a binary-type optical diffraction device. The invention also relates to an optical system including a binary-type optical diffraction device and to an optical apparatus such as an exposure apparatus, including such an optical system.

2. Description of the Related Art

A binary device is regarded in the art as an important possible technique to realize a high-accuracy optical diffraction device. The binary device is a technique to produce an optical diffraction device having a step structure in cross section such as that shown in FIG. 1B, which is an approximation of the blazed cross-sectional structure of an optical diffraction device such as that shown in FIG. 1A. The optical device shown in FIGS. 1A and 1B is a diffraction-type Fresnel lens, which is also called a kinoform. As shown in FIGS. 1A and 1B, a diffraction grating having a fine structure is formed on a transparent substrate 100 or 101. If the structure of the diffraction device is approximated by a step structure, the diffraction device can be easily produced with high precision using the semiconductor process technology which is widely used to produce an LSI or the like.

FIGS. 2A–2H illustrate the process of producing a 4-step optical diffraction device (binary device) using the semiconductor process technology. In FIGS. 2A–2H, reference numeral 110 denotes a transparent substrate on which a diffraction grating is formed, 111 a resist coated on the substrate 110, and 112 a mask used to form a grating pattern. In the first processing step shown in FIG. 2A, the resist 111 is exposed via the mask 112 to exposure light 113 so as to form a latent image corresponding to the mask pattern. Then in the processing step shown in FIG. 2B, the resist is developed so that the portions exposed to light (latent image) are removed (herein the resist is assumed to be of the positive type). In the processing step shown in FIG. 2C, the substrate 110 is etched to a predetermined depth by means of the reactive ion etching technique. Then, the remaining resist is removed. At this processing stage, a 2-step structure is obtained as shown in FIG. 2D. In the following processing step shown in FIG. 2E, another resist 114 is coated on the surface of the substrate, and the resist 114 is exposed via a mask 114 having a grating pattern with a pitch half that of the pattern formed on the mask 112. In the processing steps shown in FIGS. 2F and 2G, the resist 114 is developed so that exposed portions of the resist are removed as in the previous development process, and the substrate 110 is etched using the remaining resist as a mask. After that, the remaining resist is removed. Thus, a 4-step structure is obtained as shown in FIG. 2H. When it is desired that the number of steps in the structure be increased, the above processing steps are repeated using a mask having a pattern with a pitch half of the pattern formed on the mask 115. With this technique, although the number of steps in the structure is limited to $2^n$ (n: integer), it is possible to form a desired number of steps by properly selecting the number of masks and the line width of the mask pattern.

In the above technique, a desired step structure is formed by etching a substrate. Instead, it is also known in the art to form a step structure by performing a process repeatedly to deposit a film having a thickness equal to one step on a substrate in such a manner that the film is formed at predetermined locations. In the case where the diffraction grating structure is approximated by a step structure, although it is impossible to achieve 100% efficiency, high efficiency such as 95% for an 8-step structure and 99% for a 16-step structure can be achieved, which is good enough for practical applications.

FIG. 3 illustrates, in an enlarged fashion, a part of an optical diffraction device. With reference to this figure, the step structure will be discussed in further detail below. In this structure, it is assumed that the refractive index of the substrate 120 is $n_s$ and the refractive index of the medium 121 on which light is incident is $n_i$. The broken line 122 represents the ideal structure of the device while the solid line 123 represents the structure which approximates the ideal structure by steps. In order for the incident light to encounter an abrupt phase change of $2\pi$ at each boundary (denoted by B in FIG. 3) between adjacent units of the periodic structure, the height D of the ideal structure 122 should be $$D = \lambda/(n_s - n_i)$$

where $\lambda$ is the wavelength of the light. If each step has a height h, and the number of steps is L (six steps are shown in FIG. 3 for convenience of explanation), the height E of the step-approximated structure 123 becomes $E = (L-1)h$. There is a difference, as denoted by $\alpha$ in FIG. 3, between the heights D and E, wherein $\alpha$ satisfies the following equation:

$$(L-1)h + \alpha = \lambda/(n_s - n_i) \qquad (1)$$

Usually the structure is designed so that $\alpha = h$. In this case, it is required to meet the following condition:

$$h = D/L \text{ and } E = D \cdot (L-1)/L$$

Thus, the height of each step is given by the above equation. However, the height of each step may also be determined in another way. In the above method, when the number L of steps is determined, the height h of each step is automatically determined, and it is impossible to modify h to optimize the characteristics of the device. From this point of view, it is rather desirable that $\alpha$ be allowed to have a value within the range $0 < \alpha < h$ so that h may be set to an arbitrary desired value. In this case, if $\alpha$ is represented as $\alpha = k \cdot h$ ($0 < k < 1$), then the following equation should be met when the height h of each step and the number L of steps are determined.

$$(L-1+k)h = \lambda/(n_s - n_i) \qquad (2)$$

where k may have an arbitrary value within the range $0 < k \leq 1$.

The surface of an optical device is generally covered with an antireflection film for suppressing the reflection of light at the surface. In the case of a dioptric lens, since the surface is smooth, it is easy to form an antireflection film on the surface. As for binary devices, a technique of forming an antireflection film on the device surface is disclosed in "Anti reflection-coated diffractive optical devices fabricated by thin-film deposition", E. Pawlowski and B. Kuhlow, Opt. Eng. 33(11), 3537–3546 (1994). In this technique, as shown in FIG. 4, a material 131 for forming an antireflection film is deposited from above at right angle onto the surface of a substrate 130 by means of ion beam sputtering thereby forming a thin film 132 on the step-structured surface of the substrate 130.

FIG. 5 illustrates a multilayer antireflection film formed on the fine step-structured surface using the sputtering technique. As can been seen from FIG. 5, the antireflection film 143 formed on substrate 141 using the conventional technique has uniformity in thickness due to the steps, which causes a reduction in antireflection effect.

For a similar reason, a reduction in effect occurs when a reflection enhancement film is formed on a reflection type optical diffraction device.

SUMMARY OF THE INVENTION

It is an object of the present invention to provide an optical diffraction device having excellent capability for antireflection or reflection enhancement.

It is another object of the present invention to provide an improved illumination optical system, projecting optical system, copying machine, camera, and exposure apparatus, using an optical diffraction device. It is a further object of the present invention to provide a method of producing a device using the optical diffraction device.

According to an aspect of the present invention, there is provided an optical diffraction device including: a plurality of step-shaped elements; and an antireflection film having a flat surface, the plurality of step-shaped elements being entirely covered with the antireflection film. Various optical systems and apparatuses using the above optical diffraction device and a production method thereof are also disclosed.

Preferably, the antireflection film consists of a single transparent layer. Alternatively, the antireflection film may also consist of two transparent layers having different refractive indices, wherein one layer is disposed on the other layer.

According to another aspect of the present invention, there is provided an optical diffraction device including: a plurality of step-shaped elements; and a reflection enhancement film having a flat surface, the plurality of step-shaped elements being entirely covered with the reflection enhancement film. Various optical systems and apparatuses using the above optical diffraction device, and a production method thereof, are also disclosed.

Preferably, the reflection enhancement film consists of a single transparent layer. Alternatively, the reflection enhancement film may also consist of two transparent layers having different refractive indices, wherein one layer is disposed on the other layer.

According to still another aspect of the invention, there is provide an optical diffraction device including a plurality of step-shaped elements, wherein the plurality of step-shaped elements are formed so that interference among light rays reflected from the plurality of step-shaped elements causes the overall intensity of the reflected light rays to become substantially zero. Various optical systems and apparatuses using the above optical diffraction device, and a production method thereof are also disclosed.

Preferably, the plurality of step-shaped elements are formed so that the following conditions are satisfied:

$L=1-k+\lambda/\{(n_s-n_i)h\}$, $h=\lambda/(2pn_s)$, and $0<k\leq 1$ where
$\lambda$ is the wavelength of the reflected light rays, $n_s$ is the refractive index of each step-shaped element, $n_i$ is the refractive index of a medium occupying the space in contact with the incidence side of the plurality of step-shaped elements, L is the number of the step-shaped elements, h is the height of each step-shaped element, and p is an integer equal to or greater than 2.

Inversely, in the case of light rays emerge from the step-shaped element, the plurality of step-shaped elements are preferably formed so that the following conditions are satisfied:

$L=1-k+\lambda/\{(n_s-n_j)h\}$, $h=\lambda/(2pn_s)$, and $0<k\leq 1$ where
$\lambda$ is the wavelength of the reflected light rays, $n_s$ is the refractive index of each step-shaped element, $n_j$ is the refractive index of a medium occupying the space in contact with the light emerging side of the plurality of step-shaped elements, L is the number of the step-shaped elements, h is the height of each step-shaped element, and p is an integer equal to or greater than 2.

DESCRIPTION OF THE PREFERRED EMBODIMENTS

Figure 1A:
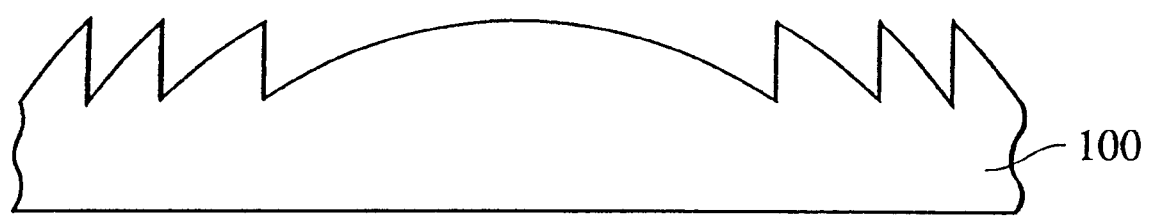
FIGS. 1A and 1B are schematic diagrams illustrating cross sections of a conventional diffraction device and a binary-type diffraction device.
Figure 1B:
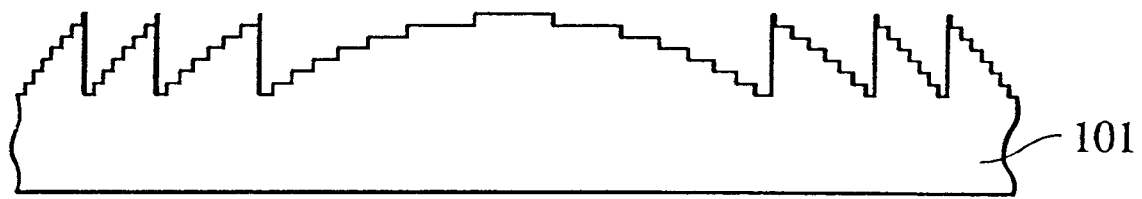
Figure 2A:
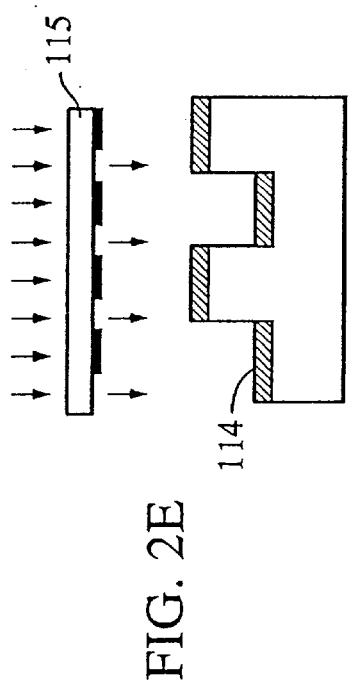
FIGS. 2A through 2H are schematic diagrams illustrating the processing steps of producing a binary-type diffraction device.
Figure 2B:
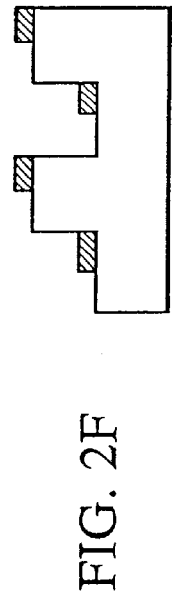
Figure 2C:
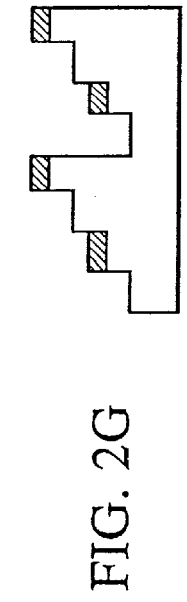
Figure 2D:
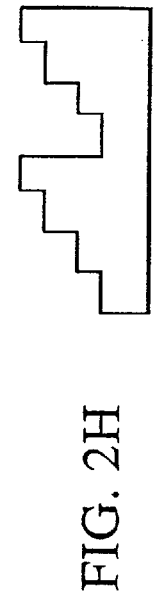
Figure 2E:
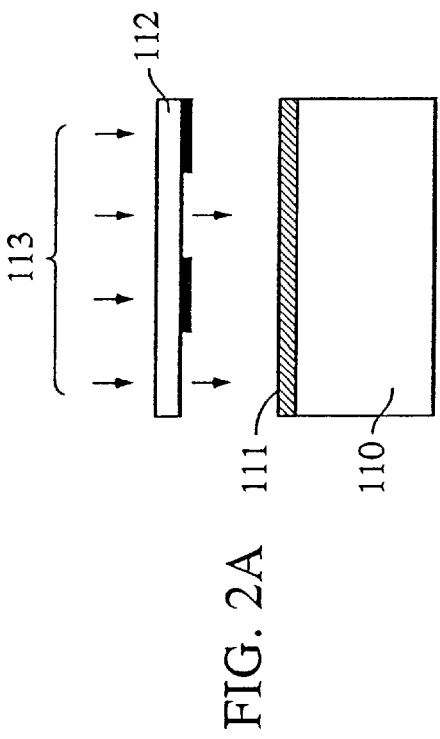
Figure 2F:
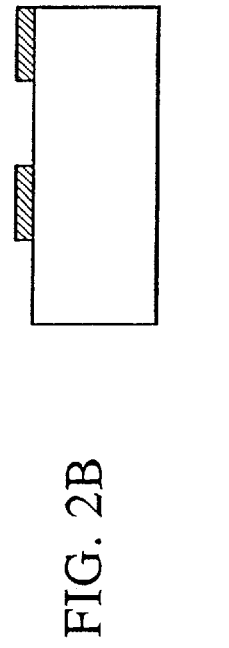
Figure 2G:
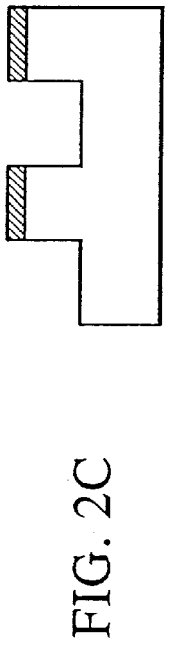
Figure 2H:
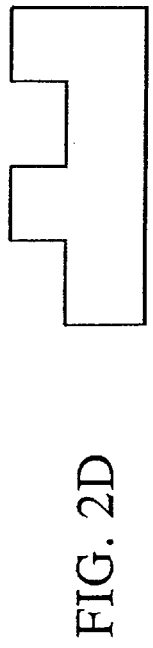
Figure 3:
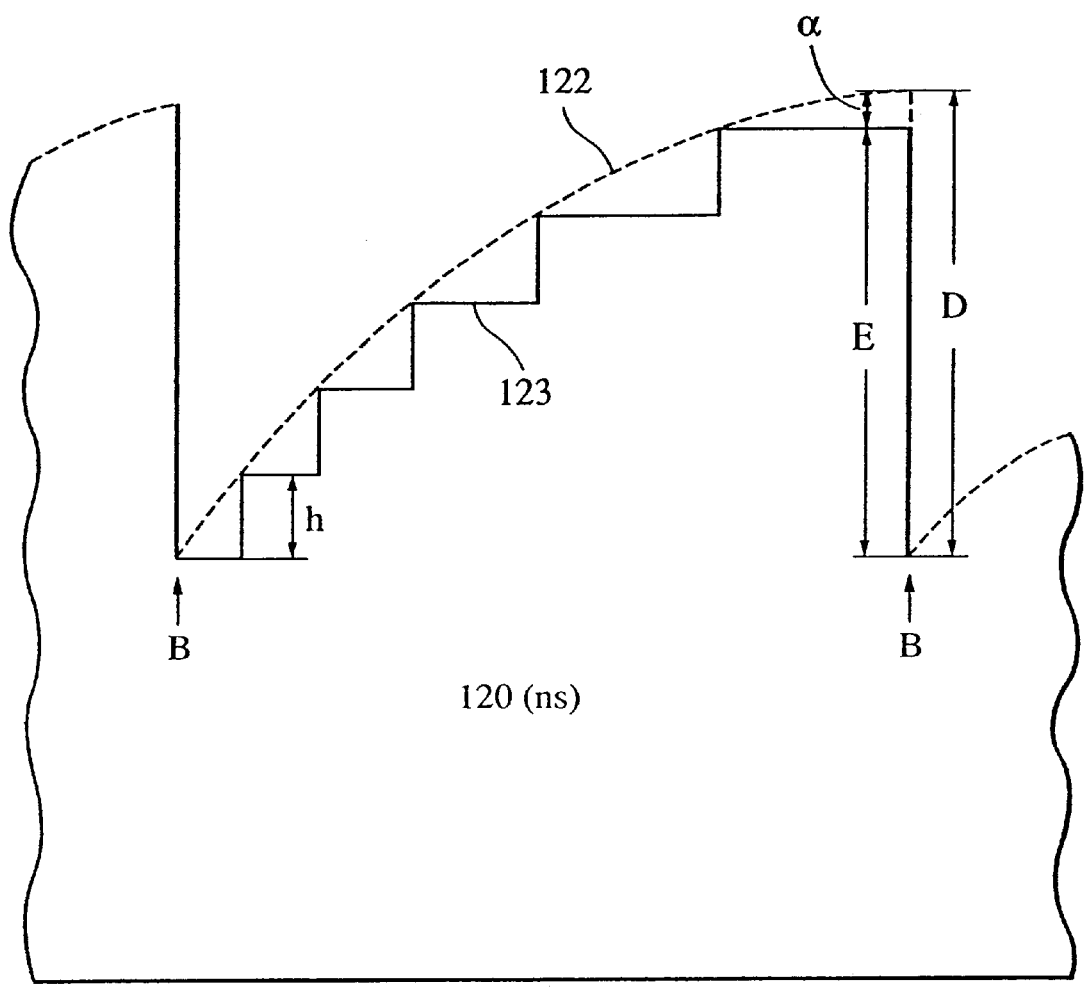
FIG. 3 is a schematic diagram illustrating the method of determining the height of steps of the binary device.
Figure 4:
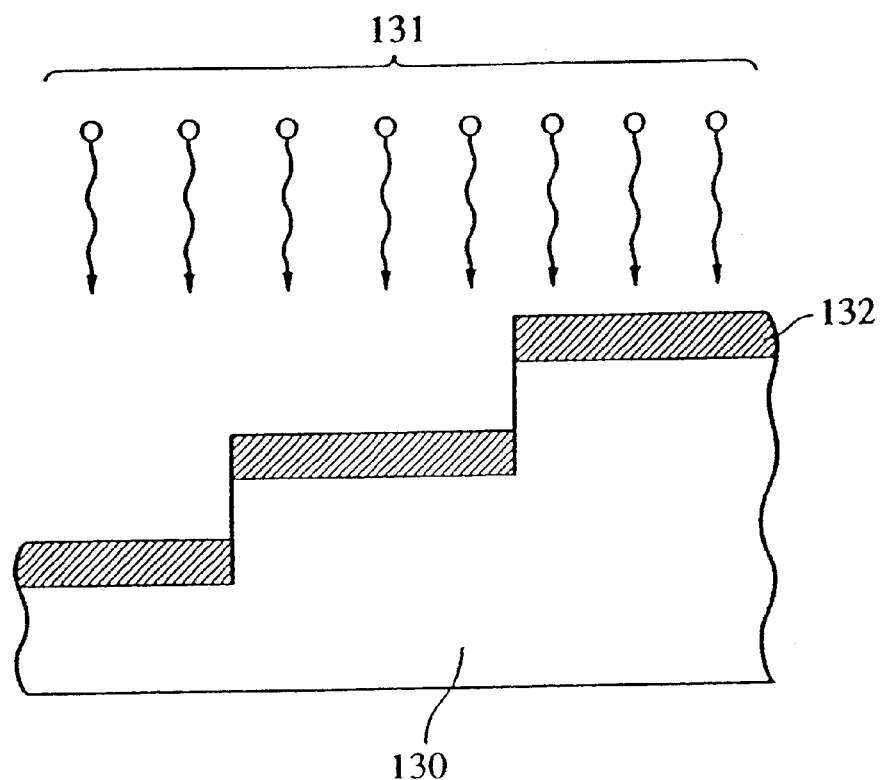
FIG. 4 is a schematic diagram illustrating a conventional method of producing an antireflection film.
Figure 6:
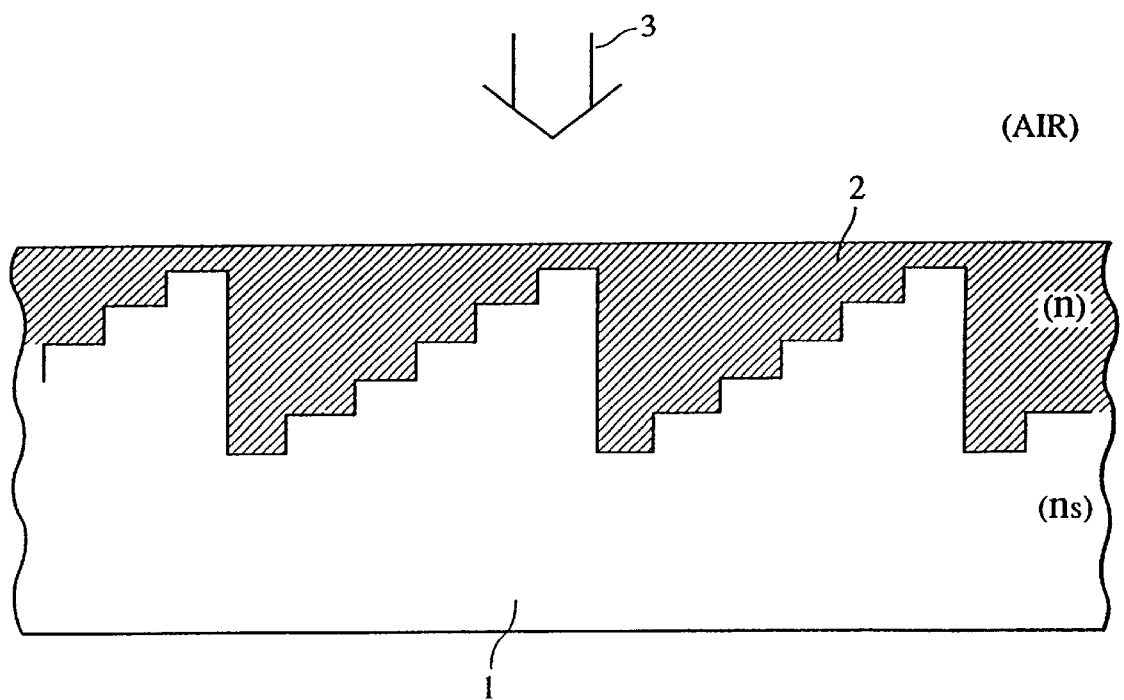
FIG. 6 is a cross-sectional view of a first embodiment of a binary-type optical diffraction device according to the invention.

A first embodiment of the invention will be described below with reference to drawings. FIG. 6 illustrates a binary-type optical device (binary device) having an antireflection film formed over a plurality of steps located side by side on the surface of the device. This optical device is a Fresnel lens similar to that shown in FIG. 1. In FIG. 6, reference numeral 1 denotes a transparent substrate (with a refractive index of $n_s$) on the surface of which a plurality of steps are formed. The transparent substrate 1 may be made up of glass or plastic. Reference numeral 2 denotes a material (with a refractive index of n) forming the antireflection film. Light 3 is incident on the optical device from above. The medium on the light incidence side is the air (with a refractive index of 1). The feature of the present embodiment is that the recessed portions of the surface structure of the binary device are fully filled with the material of the antireflection film so that the steps are entirely covered with the thin film having a flat surface, wherein the height of each step and the refractive index $n_s$ of the material 2 of the antireflection film are determined so that the antireflection conditions are satisfied for each step.

Figure 7:
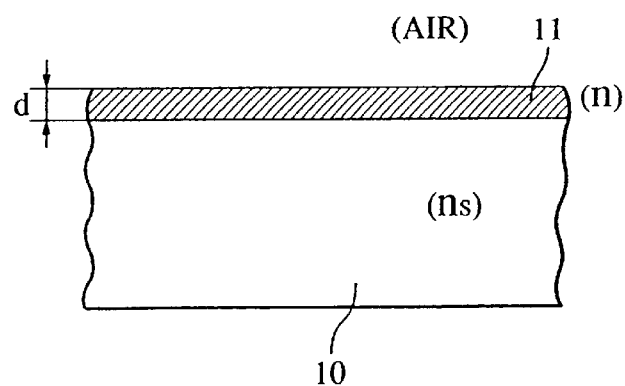
FIG. 7 is a schematic diagram illustrating the function of a single-layer antireflection film.

The principle of the antireflection film of the present embodiment will be described below. First, general conditions required to achieve antireflection will be discussed briefly. FIG. 7 illustrates a single-layer antireflection film which is the most fundamental structure of the antireflection film. The condition required to be satisfied to achieve antireflection at the boundary between the air and a transparent substrate 10 with a diffractive index of $n_s$ will be discussed below. When a transparent single-layer film 11 with a thickness of d and a diffractive index of n is formed on the substrate 10, the following equations (3) and (4) should be met in order to achieve antireflection against light with a wavelength of λ:

$$nd = (1/4 + m/2)\lambda \quad (m=0, 1, 2,) \tag{3}$$

$$n = \sqrt{n_s} \tag{4}$$

Equation (3) represents the phase condition and equation (4) represents the amplitude condition. In equation (3), if various values are given to m, the phase condition of antireflection is satisfied for various values of d given by:

λ/4n, 3λ/4n, 5λ/4n, 7λ/4n, 9λ/4n,

In equation (4), on the other hand, if it is assumed that the refractive index of the substrate is equal to a typical value of that of common glass (for example $n_s=1.52$), then n becomes n=1.23. However, there is no practical material having such a refractive index. One of practical materials is $MgF_2$. Although $MgF_2$ has a greater refractive index (n=1.38) than the ideal value, the residual reflection due to the difference in the refractive index is small enough.

Figure 8:
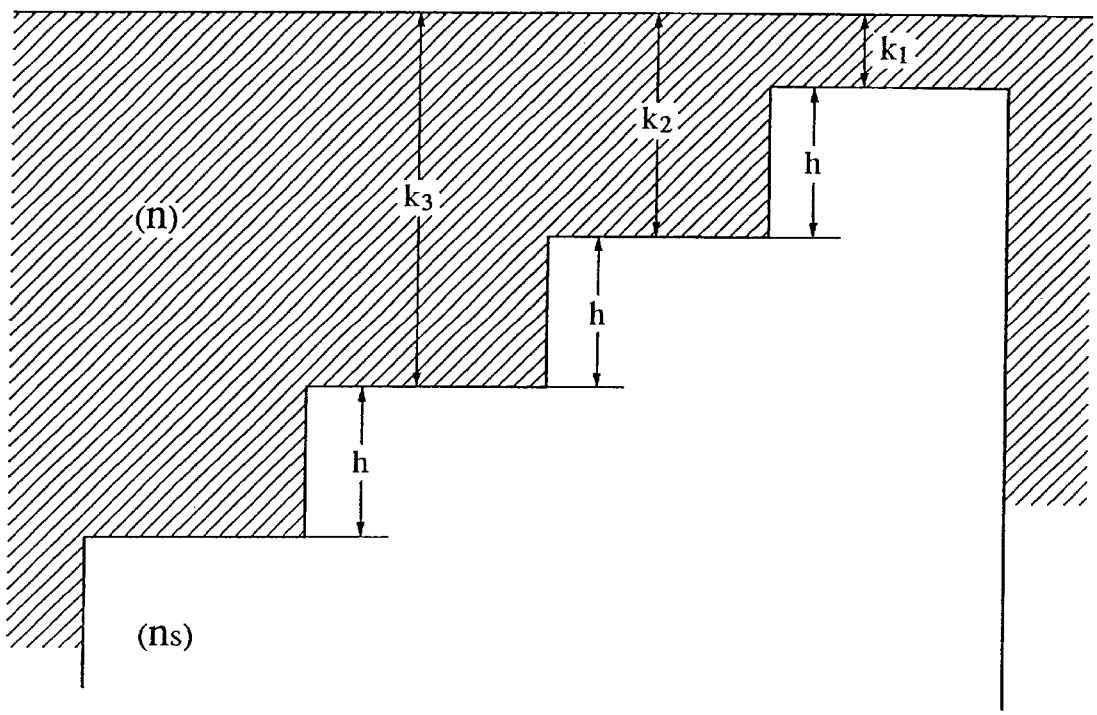
FIG. 8 is an enlarged cross-sectional view illustrating a part of a binary-type optical device according to a first embodiment of the invention.

In the present embodiment, the thickness of the antireflection film is determined in accordance with the height of each step of the binary device so that the conditions given by equations (3) and (4) are satisfied at any locations corresponding to the respective steps. The procedure of determining the thickness is described with reference to FIG. 8. When the height h of each step is given, the optimum thickness can be determined for the given height h as follows. From the antireflection equations described above, the thickness $k_1$ of the antireflection film at a location corresponding to the highest step is given as λ/(4n), the thickness $k_2$ on the next highest step as 3λ/(4n), the thickness $k_3$ on the further next highest step as 5λ/(4n), and so on. This means that the difference in thickness of the film between adjacent steps should be λ/(2n). If the above difference in thickness of the film is equal to the height h of each step, then the antireflection conditions are satisfied for all the steps. Substituting $n_i = n$ into equation (2) yields $$L-1+k = 2n/(n_s - n) \quad (0 < k \le 1)$$

Furthermore, if actual values $n_s = 1.52$ and n 1.38 are substituted into the above equation, then L=20 is concluded. That is, if the binary structure is formed in such a manner as to have 20 steps, antireflection is achieved.

Figure 9A:
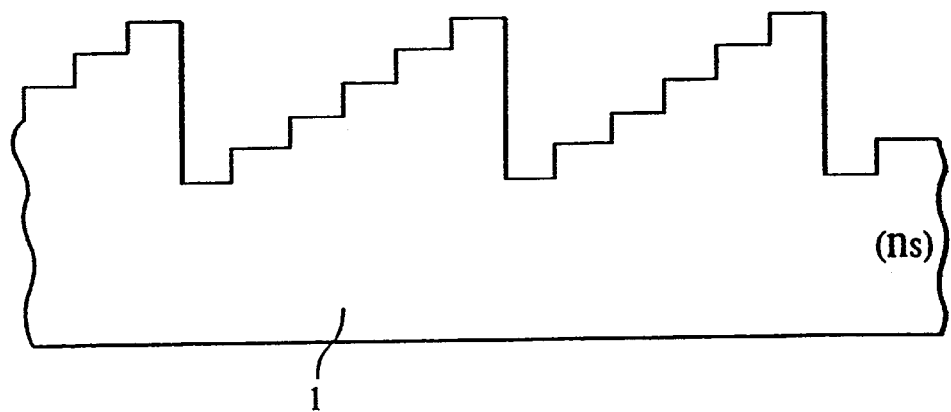
FIGS. 9A through 9C are schematic diagrams illustrating a method of producing an antireflection film.
Figure 9B:
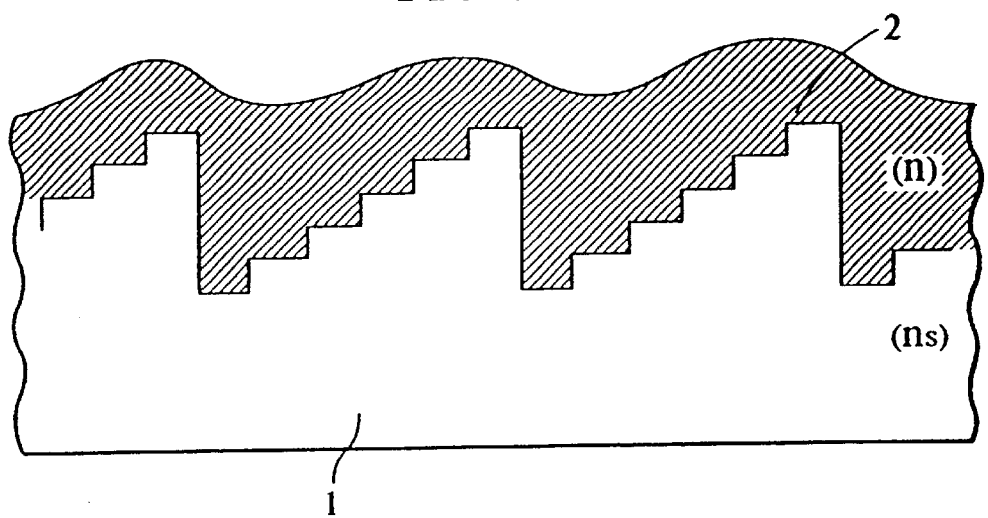
Figure 9C:
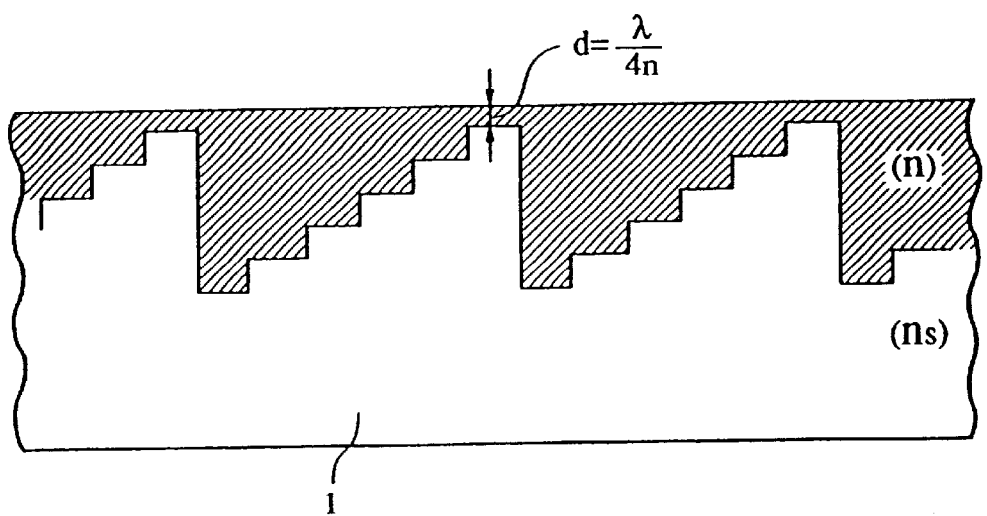

Referring now to FIGS. 9A–9C, a method of producing the antireflection film shown in FIG. 6 is described below. FIG. 9A illustrates a transparent substrate 1 on which an antireflection film has not been formed yet. FIG. 9B illustrates the structure which now includes an antireflection film 2 formed by depositing a proper material on the transparent substrate 1 using the ion beam sputtering technology or the like. At the processing step shown in FIG. 9B, the antireflection film 2 has an nonuniform surface due to the step structure on the substrate 1. The surface of the antireflection film 2 is lapped so that the film thickness at a location corresponding the highest step becomes d=λ/(4n) as shown in FIG. 9C and thus the antireflection film is formed into the final shape having the flat surface.

In the first embodiment described above, the antireflection film is formed into a single layer structure. However, this single layer structure causes a slight amount of residual reflection. In the second embodiment described below, an antireflection film is formed into a two-layer structure which can prevent the reflection substantially perfectly.

Figure 10:
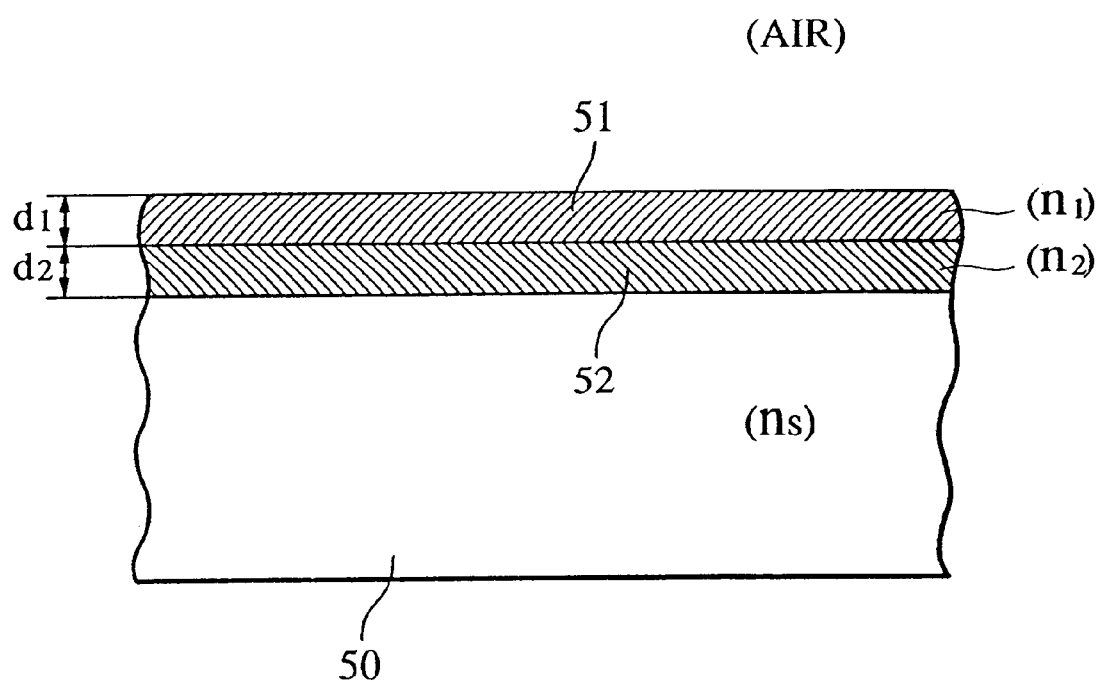
FIG. 10 is a schematic diagram illustrating the function of a two-layer antireflection film.

First, the structure of a two-layer antireflection film will be described below. Referring to FIG. 10, the antireflection conditions at the boundary between the air and a transparent substrate 50 with a refractive index of $n_s$ will be discussed below. If the first-layer transparent film 51 has a thickness $d_1$ and a refractive index $n_1$, and the second-layer transparent film 52 has a thickness $d_2$ and a refractive index $n_2$, wherein $1 < n_1 < n_2 > n_s$, then the phase condition is given by:

$$n_1 d_1 = (1/4 + m_1/2)\lambda \quad (m_1=0, 1, 2, \tag{5}$$

$$n_2 d_2 = (1/4 + m_2/2)\lambda \quad (m_2=0, 1, 2,) \tag{6}$$

Furthermore, the amplitude condition is given by:

$$n_2/n_1 = \sqrt{n_s} \tag{7}$$

The condition represented by equation (5) and (6) can be satisfied by properly selecting the film thickness. On the other hand, the condition represented by equation (7) can be approximately satisfied if $MgF_2$ (with n=1.38) is employed as the practical material for the first layer and $Al_2O_3$ (with n=1.62) is employed for the second layer.

Figure 11:
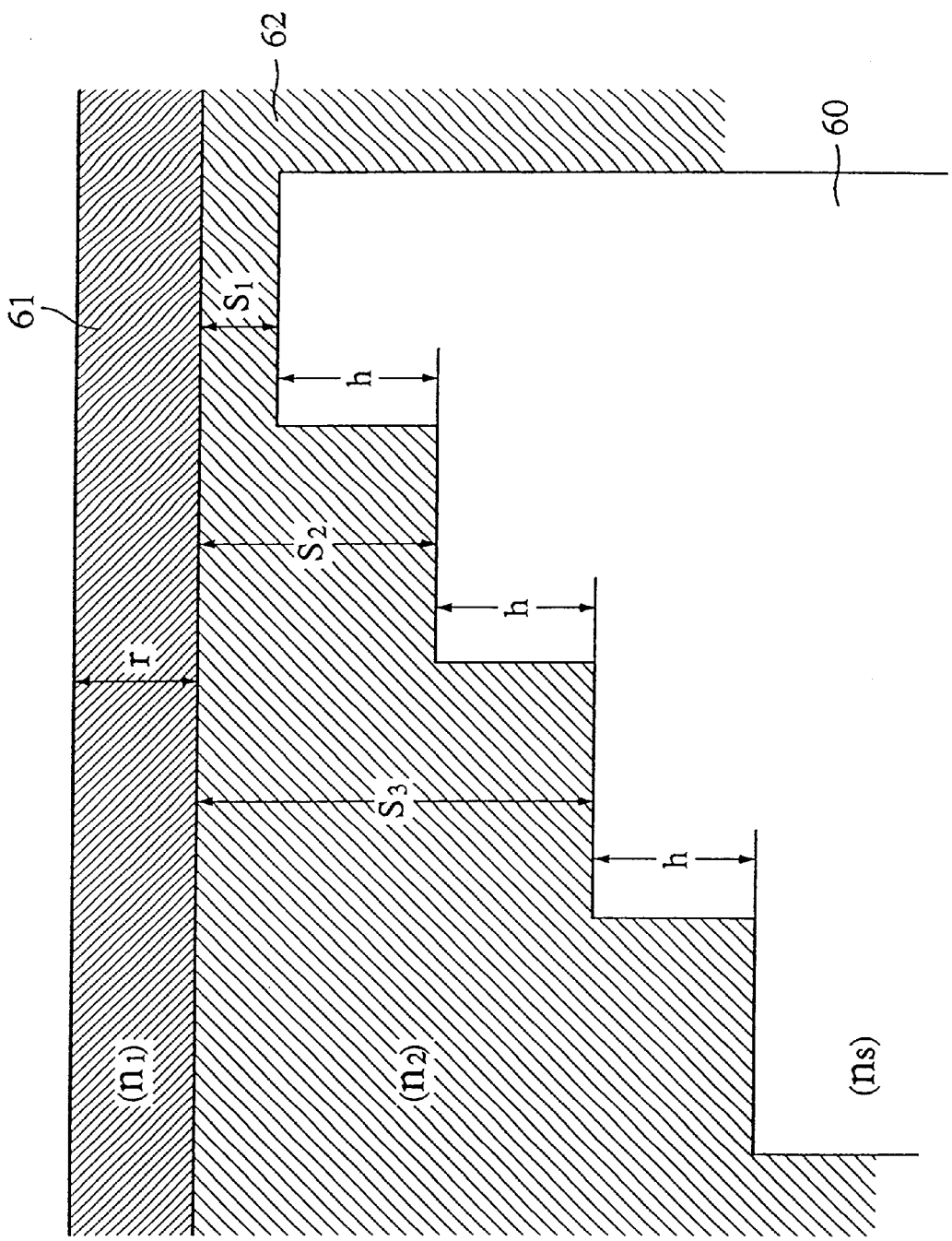
FIG. 11 is a cross-sectional view of a second embodiment of a binary-type optical diffraction device according to the invention.

Now referring to FIG. 11, the application of the above two-layer film to the present invention is discussed below. In FIG. 11, reference numeral 60 denotes a substrate on which a binary device having a plurality of steps are formed. On the substrate 60, there are disposed an antireflection film consisting of films 61 and 62. If the refractive index and thickness of the film 61 are $n_1$ and r, respectively, then these two values should meet equation (5). On the other hand, the film 62 should meet the antireflection condition (6), therefore, if the refractive index of the film 62 is $n_2$, then the thickness $s_1$ of the antireflection film at a location corresponding to the highest step is given as $\lambda/4n_2$, the thickness $s_2$ on the next highest step as $3\lambda/4n_2$, the thickness $s_3$ on the further next highest step as $5\lambda/4n_2$, and so on. That is, the difference in thickness of the film between adjacent steps should be $\lambda/2n_2$. In the above description, $\lambda$ is the wavelength of incident light. If the above difference in thickness of the film is equal to the height h of each step, then the antireflection conditions are satisfied for all the steps. If this is expressed by an equation, then $$L-1+k=2n_2/|n_s-n_2|$$

where L and k denote similar parameters to those in the first embodiment described above. Furthermore, if actual values $n_s=1.52$ and $n_2=1.62$ are substituted into the above equation, then L=33 is concluded. That is, if the binary structure is formed in such a manner as to have 33 steps, antireflection is achieved. Thus, if the second-layer film 62 is formed according to the method described above with reference to FIG. 9 and the first-layer film 61 is then formed thereon according to a widely-used technique, the antireflection film according to the present embodiment is formed.

The antireflection film in the form of a single-layer or a two-layer structure has been described above. It is known in the art that the multilayer antireflection film should include a sufficiently large number of layers to have an excellent antireflection effect for a wide range of wavelengths of the incident light and for a wide range of the incidence angles. The present invention may also be applied directly to such a multilayer antireflection film consisting of such a large number of layers. In this case, the number of steps of a binary device is determined taking into account the refractive index of the bottom layer (film) having a flat surface.

In the above embodiments, the height of each step and the number of steps are optimized so as to minimize the reflection for light incident at a right angle on the surface of the binary device. Instead, it is also possible to determine the height of each step and the number of steps so that the reflection is minimized for light incident at a certain angle rather than at a right angle.

It is also known in the art to use an optical diffraction device called a Fresnel zone plate to make changes by an amount of $\pi$ in the phase of transmission light. The structure of the Fresnel zone plate is exactly equivalent to the structure of a 2-step binary device, and therefore it is possible to directly apply the antireflection film technique of the present invention to it.

The techniques of forming an antireflection film on a binary optical device of the transmission type have been described above. The present invention may also be used to form a reflection enhancement film on a binary device of the reflection type.

In this embodiment, the optical diffraction device having the antireflection film may be formed in various fashions. For example, it may be formed in such a manner that the optical diffraction device has a step-structured surface on one side of a transparent substrate and has a flat or spherical surface on the other side, or in such a manner that the optical diffraction device has a step-structured surface on one side of a transparent substrate and has an aspheric surface on the other side, or otherwise in such a manner that the optical diffraction device has a step-structured surface on both sides of a transparent substrate.

Figure 12:
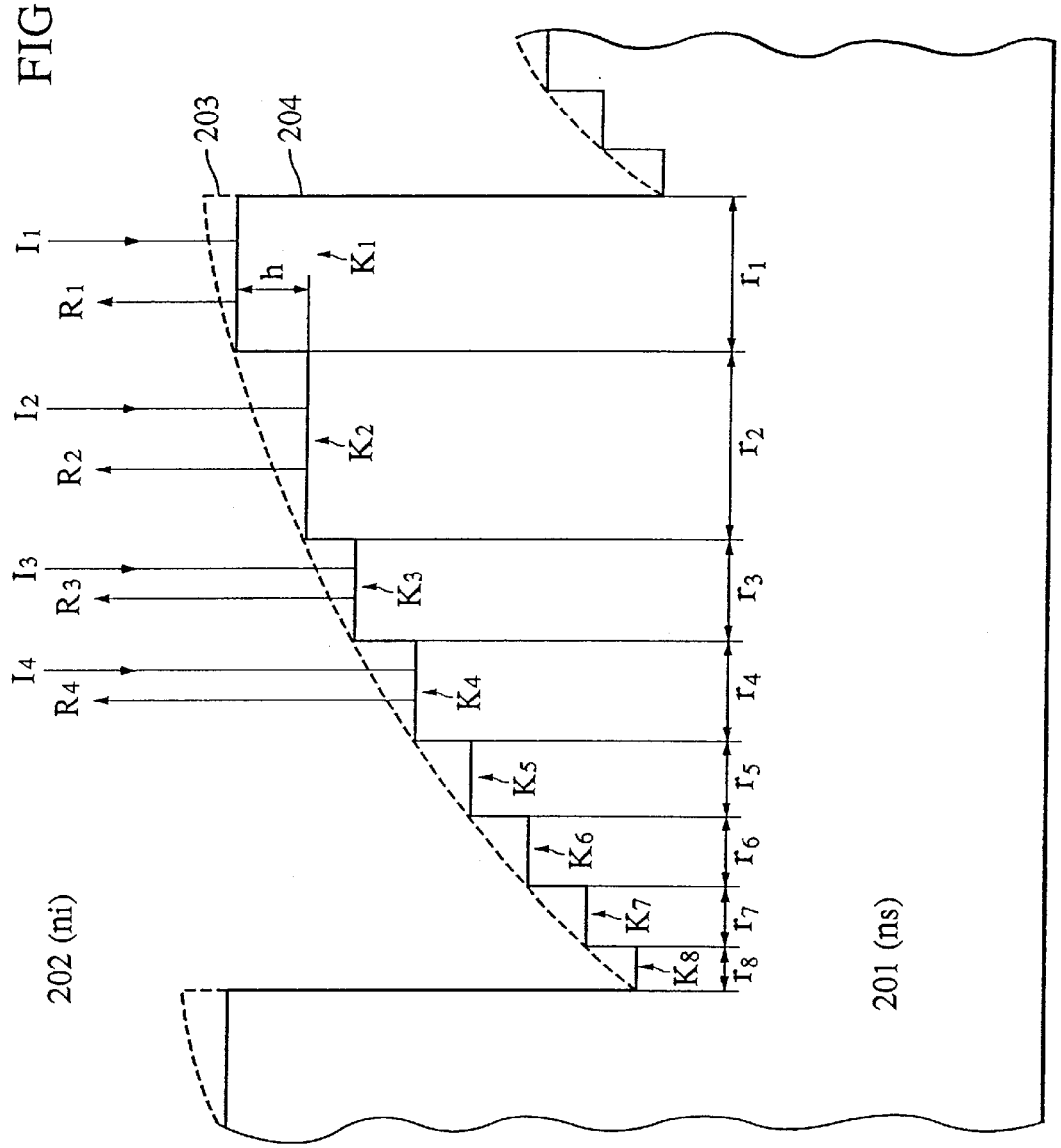
FIG. 12 is a cross-sectional view of a third embodiment of a binary-type optical diffraction device according to the invention.

A third embodiment of the invention will be described below with reference to some drawings. FIG. 12 illustrates a part of a binary-type optical diffraction device (binary device) having the capability of suppressing reflection at its surface. This optical device is a Fresnel lens similar to that shown in FIG. 1. In FIG. 12, reference numeral 201 denotes a transparent substrate made up of glass or plastic (with a refractive index of $n_s$) on which a binary device is formed. Light is incident on the binary device through a medium 202 (with a refractive index of $n_i$). The broken line 203 represents the ideal structure of the device serving as a Fresnel lens. The solid line 204 represents the actual structure of the binary device which approximates the ideal structure 203 by steps. The steps include eight sections $K_1$ to $K_8$ having widths $r_1, r_2, \ldots, r_8$, respectively. Each step has an equal height h as shown in FIG. 12. $I_1, I_2, \ldots$, represent light rays incident on the sections $K_1, K_2, \ldots$, respectively, and $R_1, R_2, \ldots$ represent light rays reflected from the sections $K_1, K_2, \ldots$. In FIG. 12, the light rays $I_5$ to $I_8$ incident on the sections $K_5$ to $K_8$ and the light rays $R_5$ to $R_8$ reflected therefrom are not shown for simplicity. The incident light rays $I_1$ to $I_8$ are plane waves having the same phase. However, when the light rays are reflected at the surfaces of the respective sections, variations occur in phase and thus the reflected light rays $R_1$ to $R_8$ are plane waves having different phases. The overall intensity of the reflected light can be determined by summing $R_1$ to $R_8$ reflected from the steps of sections $K_1$ to $K_8$ taking the phase into account. The structure of the binary device shown in FIG. 12 is designed so that interference among the light rays reflected from the respective steps causes the overall intensity of the reflected light rays to become zero.

Figure 13:
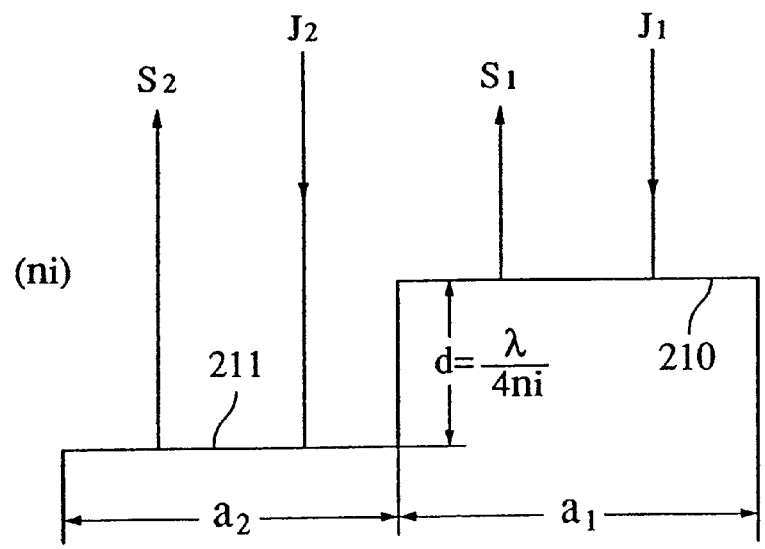
FIG. 13 is a schematic diagram illustrating a condition in which reflected light is eliminated.

The condition for the overall intensity of the reflected light to become zero as a result of interference is discussed below. In FIG. 13, a section 210 has a width of $a_1$ and a section 211 has a width of $a_2$ wherein a step with a height of d is formed between the sections 210 and 211. Plane waves J1 and J2 having the same phase are incident on the sections 210 and 211. The medium occupying the incidence space has a refractive index of $n_i$. A difference in optical path occurs between the light ray S1 reflected from the section 210 and the light ray S2 reflected from the section 211 wherein the difference is given as $2n_i d$. In order that the reflected light rays S1 and S2 cancel each other so that the overall intensity becomes zero, it is required that the reflected light rays S1 and S2 be equal in amplitude but opposite in phase (that is, different in phase by 180°). If the wavelength of the incident light in vacuum (hereinafter such the wavelength will be referred to simply as the wavelength) is $\lambda$, the condition in terms of the phase is given by $$2n_i d=\lambda/2 \text{ (or } d=\lambda/4n_i\text{)}$$

Furthermore, the widths $a_1$ and $a_2$ should be equal to each other to satisfy the amplitude condition.

In the above discussion, the structure is assumed to have two steps. The phase and amplitude conditions of the reflected light will be described below for other structures having different numbers of steps with reference to FIGS. 14 and 15.

Figure 14:
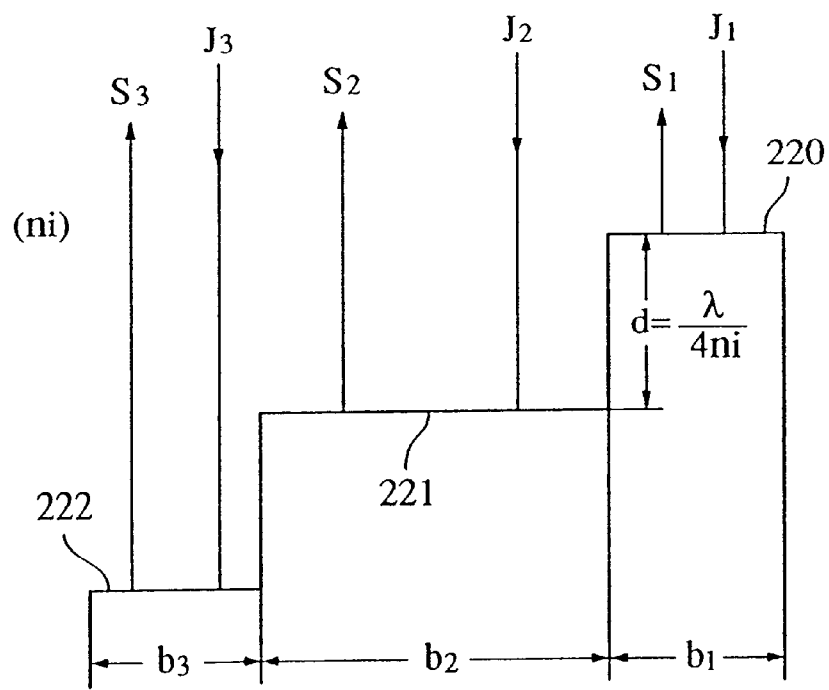
FIG. 14 is a schematic diagram illustrating another condition in which reflected light is eliminated.

In FIG. 14, there are three sections 220, 221, and 222 having widths $b_1$, $b_2$, and $b_3$, respectively, and there is a step at each boundary between adjacent sections wherein each step has an equal height d given by:

$$d=\lambda/4n_i$$

Light rays JI to J3 which are equal in phase are incident on the respective sections. The light rays J1 to J3 are reflected by the steps and the resultant reflected light rays S1 to S3 become different in phase. If the steps have the above height, the reflected light rays S2 and Si become opposite in phase to each other and similarly the reflected light rays S2 and S3 become opposite in phase to each other. As a result, the reflected light rays S1 and S3 become equal in phase. Therefore, if the sections are formed in such a manner that their widths satisfy the condition $b_2=b_1+b_3$, then interference occurs among the reflected light rays which causes the overall intensity to become zero.

Figure 15:
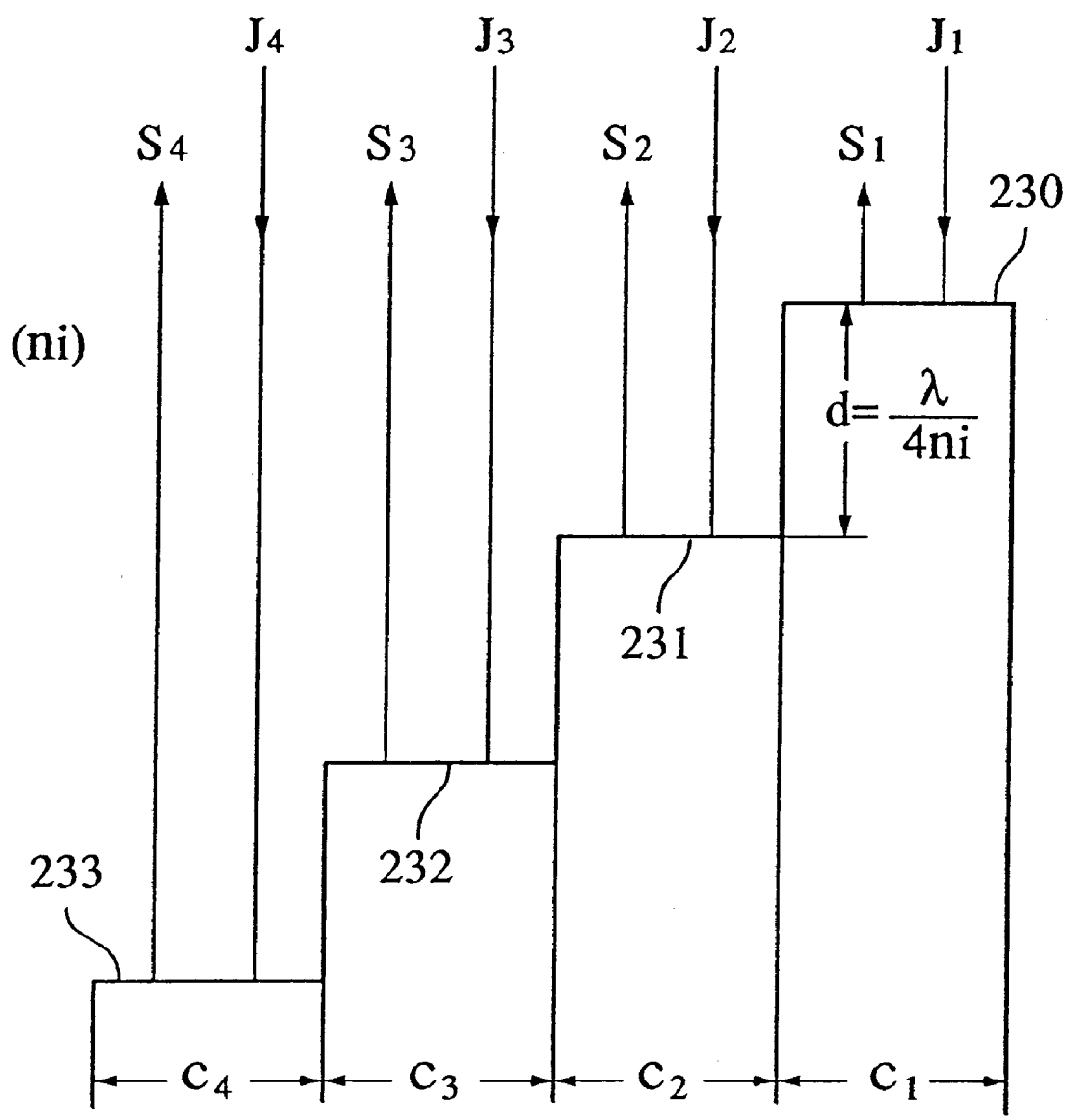
FIG. 15 is a schematic diagram illustrating still another condition in which reflected light is eliminated.

In the case of FIG. 15, there are four sections 230, 231, 232, and 233 having widths $c_1$, $c_2$, $c_3$, and $c_4$, respectively, and there is a step at each boundary between adjacent sections wherein each step has an equal height d given by:

$$d=\lambda/4n_i$$

Light rays J1 to J4 which are equal in phase are incident on the respective sections. The light rays J1 to J4 are reflected by the steps and the resultant reflected light rays S1 to S4 become different in phase. If the steps have the above height, the phases of the reflected light rays S1 and S3 become opposite to that of the reflected light ray S2, while the reflected light rays S4 and S2 become equal in phase. Therefore, if the widths of the respective sections satisfy the condition $c_1+C_3=C_2+C_4$, interference occurs among the reflected light rays such that the overall intensity becomes zero. Similarly, when structures have 5, 6, 7, or more steps, if a step having a height d is formed at each boundary between adjacent sections so that each step has a height d given by:

$$d=\lambda/4n_i$$

then antireflection is also achieved.

Now, the above discussion can be applied to the binary device shown in FIG. 12. In order that interference occur among the reflected light rays $R_1$ to $R_8$ such that the overall intensity becomes zero, each step should have a height h given by $$h=\lambda/4n_i$$

As described earlier, it is required that the steps of the binary-type optical diffraction device should be formed so that their height meets the condition represented by equation (2). Thus, if $$h=/4n_i$$

is substituted into equation (2) and the result is rearranged, then $$L-1+k=/4n_i/(n_s-n_i) \quad (8)$$

If practical values are given such that the refractive index of the substrate on which the binary device is formed is $n_s=1.52$ and the medium of the incidence space is assumed to be the air (with $n_i=1.0$), then L=8 and k=0.69 are concluded. Since k can take any value in the range of $0<k\leq 1$ as described above, it is possible to achieve cancellation among the reflected light rays in the 8-step structure shown in FIG. 12. In order to actually obtain the intensity of zero in the reflected light, it is required that the sum of amplitudes of a set of light rays ($R_1$, $R_3$, $R_5$, $R_7$) which are equal in phase should be equal to the sum of amplitudes of the other set of light.rays.($R_2$, $R_4$, $R_6$, $R_8$) which are equal in phase. Thus, in the specific example shown in FIG. 12, the widths $r_1$ to $r_8$ of the respective sections are selected so that $r_1+r_3+r_5+r_7=r_2+r_4+r_6+r_8$ is satisfied. In FIG. 12, since the cross section of the binary device is represented in a two-dimensional space, the step is represented by the "width". However, the practical binary device has a three-dimensional structure in which the "width" of each step corresponds to the "area" of the step.

In the example shown in FIG. 12, the structure is designed so that cancellation occurs within each periodic unit including sections $K_1$ to $K_8$ of the binary device. However, the structure may also be designed so that cancellation occurs in a wider range in which the incident light can maintain coherence thereby achieving the overall intensity of zero.

The condition of eliminating the reflection of light incident on a binary device via the air has been discussed above. Now, the condition which should be met to achieve antireflection for light emerging from a binary device into the air will be discussed below. It is assumed herein that a binary device is formed on a substrate with a refractive index of $n_s$ and that light is emitted into a medium with a refractive index of $n_j$. If the height of each step has a value given by $$h'=\lambda/4n_s$$

then an equation corresponding to equation (2) described is given by $$(L-1+k)\ h'=\lambda/(n_s-n_j) \quad (9)$$

If $$h'=\lambda/4n_s$$

is substituted into equation (9), then $$L-1+k=4n_s/(n_s-n_j)$$

Thus, if $n_s=1.52$ and $n_j=1.0$ are assumed, then L=12 and k=0.69 are obtained. This means that, antireflection can be achieved by forming the structure so that it has twelve steps.

Figure 16:
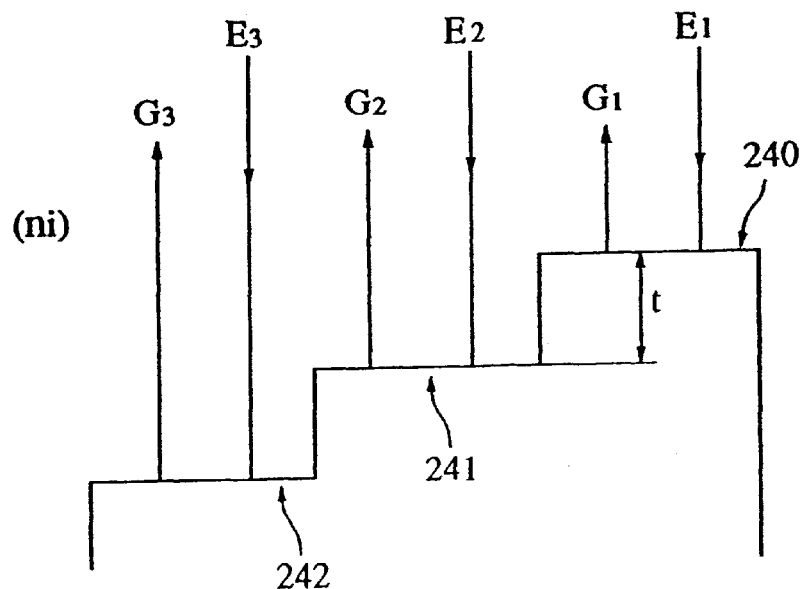
FIG. 16 is a schematic diagram illustrating another condition in which reflected light is eliminated.

In the third embodiment described above, each step is assumed to have a height given by $$h=\lambda/4n_i$$

and antireflection is achieved by forming the structure such that the light rays reflected from adjacent steps become opposite in phase (that is, different in phase by 180°). Instead, the structure may also be formed such that light rays reflected from adjacent steps have a phase difference of 120° as described below. In FIG. 16, the structure includes three sections 240, 241, and 242 wherein a step having a height of t is formed at each boundary between adjacent sections. Light rays $E_1$ to $E_3$ having an equal phase are incident on the respective sections and they are reflected from the respective sections as represented by $G_1$ to $G_3$. If two light rays, which are equal in amplitude but different in phase by 180°, interfere with each other, the overall intensity becomes zero as described earlier. The overall intensity of zero can also be achieved if three light rays, which are equal in amplitude but different in phase 120°, interfere with one another. There is a difference of $2n_i t$ in optical phase between the reflected light rays $G_1$ and $G_2$ and also between the reflected light rays $G_2$ and $G_3$. Therefore, if $$2n_i t = \lambda/3$$

then the phase difference becomes 120°. Thus, the height t of each step should be equal to:

$$t = \lambda/6n_i$$

If h in equation (2) is replaced by the above value for t, and furthermore $n_s=1.52$ and $n_i=1.0$ are substituted into equation (2), then L=12 is obtained. Thus, if twelve steps each having a height given by $$\lambda/6n_i$$

are formed, then antireflection is achieved in the binary device.

Figure 17:
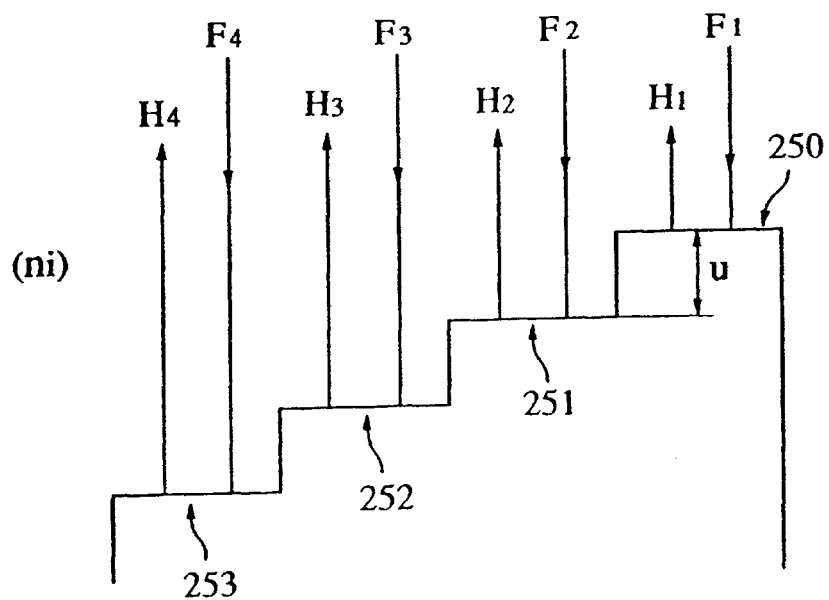
FIG. 17 is a schematic diagram illustrating still another condition in which reflected light is eliminated.

Now referring to FIG. 17, the condition in which the phase difference between adjacent reflected light rays is 90° will be discussed below. In FIG. 17, there are four sections 250, 251, 252, and 253, and a step having a height u is formed at each boundary between adjacent sections. Light rays $F_1$ to $F_4$ which are equal in phase are incident on the respective sections, and they are reflected from the respective sections as represented by $H_1$ to $H_4$. In this case, the overall intensity becomes zero if the reflected light rays are equal in amplitude but have changes in phase by amounts of 0°, 90°, 180°, and 270°, respectively, and thus there is a difference of 90° in phase between adjacent reflected light rays. More specifically, the phase of the reflected light ray $H_2$ is delayed by an amount of 90° relative to the phase of the reflected light ray $H_1$, the phase of the reflected light ray $H_3$ is delayed by an amount of 180° relative to the phase of the reflected light ray $H_1$, and the phase of the reflected light ray $H_4$ is delayed by an amount of 270° relative to the phase of the reflected light ray $H_1$. Since there is a difference of $2n_i u$ in optical path between adjacent reflected light rays, the phase difference between the adjacent reflected light rays becomes 90° if $$2n_i u = \lambda/4$$

Thus, the height u of each step is given by $$u = \lambda/8n_i$$

If h in equation (2) is replaced by the above value for u, and furthermore $n_s=1.52$ and $n_i=1.0$ are substituted into equation (2), then L=16 is concluded. Thus, if sixteen steps each having a height given by $$\lambda/8n_i$$

are formed, then antireflection is achieved in the binary device.

The above discussion can be expanded to a general condition to achieve antireflection. That is, if each step has a height given by $$\lambda/2pn_i$$

(p is an integer equal to or greater than 2) then antireflection is achieved.

In conclusion, the reflected light rays are eliminated when the following conditions are satisfied:

(1) When light rays are incident on a binary device (with a refractive index of $n_s$) via a medium with a refractive index of $n_i$, height of each step: $h = \lambda/2pn_i$
    number of steps: $L = 1-k+\lambda/\{(n_s-n_i)h\}$ (2) When light rays emerge from a binary device (with a refractive index of $n_s$) into a medium with a refractive index of $n_j$, height of each step: $h' = \lambda/2pn_s$
    number of steps: $L = 1-k+\lambda/\{(n_s-n_j)h'\}$ where, in each case, p is an integer equal to or greater than 2, and k is a real number in the range of 0<k<1.

In the above embodiments, the height of each step and the number of steps are determined so that the reflection is minimized for the light rays incident at a right angle on the surface of a binary device. However, in the present invention, the height of each step and the number of steps may also be determined so that the reflection is minimized for the light rays incident at an certain angle other than the right angle on the surface of a binary device.

Figure 5:
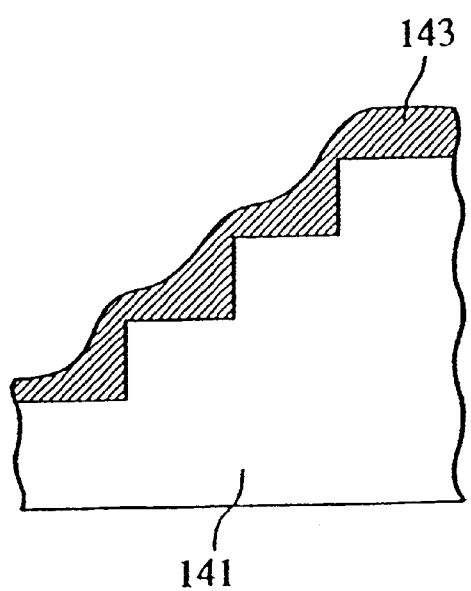
FIG. 5 is a schematic diagram illustrating the structure of a conventional antireflection film.
Figure 18:
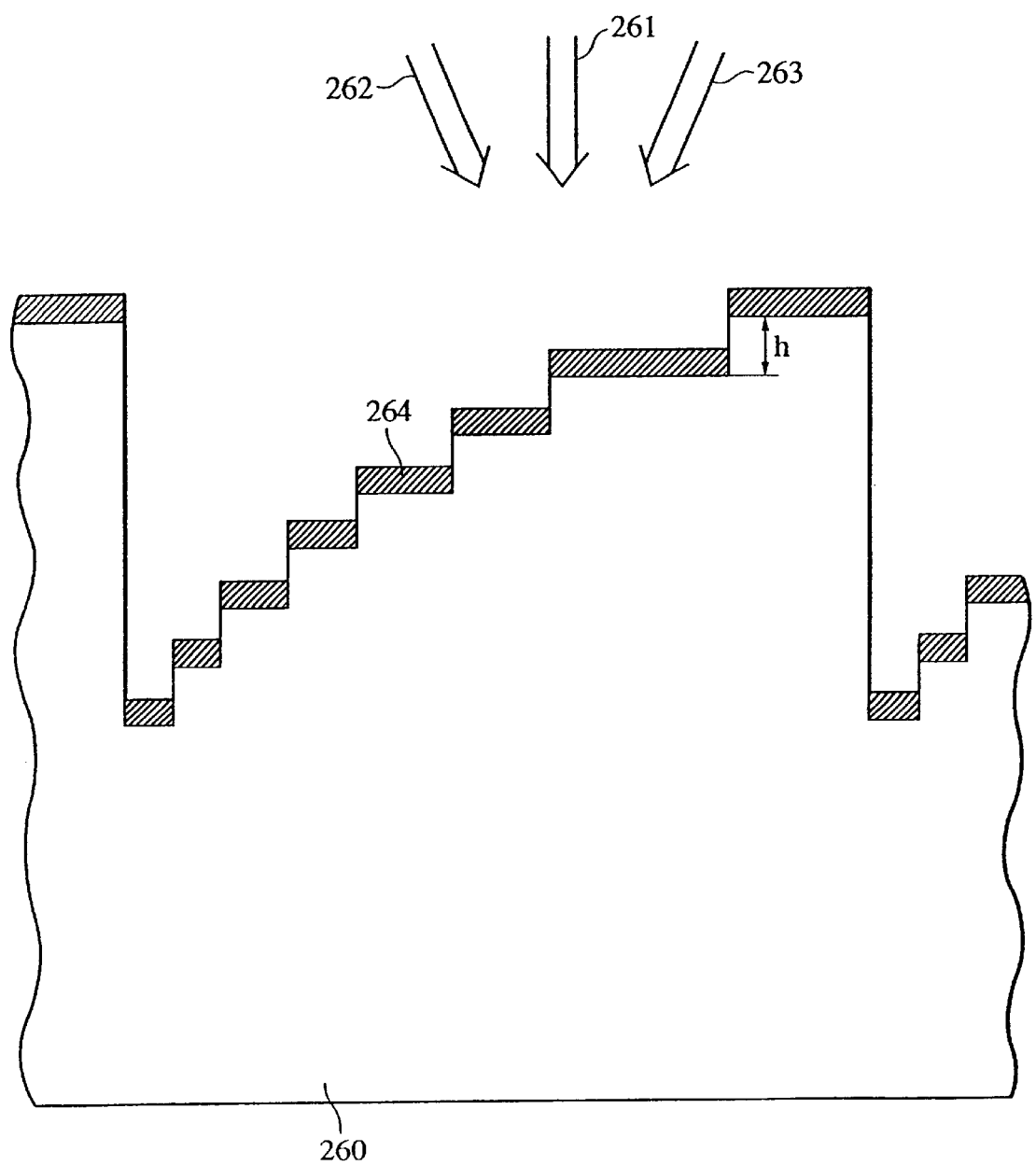
FIG. 18 is a schematic diagram illustrating a combination of an antireflection film and a binary-type optical diffraction device.

As shown in FIG. 18, a binary-type optical diffraction device (binary device) of the present invention may be combined with a conventional antireflection film. In the binary device 260 according to the invention shown in FIG. 18, the height h of each step is determined in the same manner as in the embodiments described above so that the reflection is minimized for the light rays 261 incident at a right angle on the surface of the device 260. When an optical device is used in an optical system, the incident angle of light is not limited to 90°, but the light incident on the device usually includes various components having various incident angles in a certain range. In FIG. 18, the incident light is assumed to include oblique light ray components 262 and 263. According to a conventional technique, an antireflection film includes 10 or a similar large number of layers so that antireflection can be achieved not only for a light ray incident at a right angle but also for light rays incident at oblique angles. On the other hand, the binary device 260 according to the present invention has the capability of preventing the light ray 261 incident at a right angle from being reflected even when no additional antireflection film exists. If an antireflection film 264 is additionally formed so that the reflection of the oblique light rays 262 and 263 is prevented by the antireflection film 264, it is possible to achieve excellent antireflection against light rays incident at various angles with the antireflection film consisting of a small number of layers. In this case, since the antireflection film does not need to include a great number of layers, the antireflection film can be formed without encountering the problem described above with reference to FIG. 5.

Alternatively, the height of each step and the number of steps of the binary device may also be selected in such a manner as to minimize the reflection of the light rays incident at oblique angles, and an antireflection film 264 may be formed on the binary device in such a manner that its reflectivity is minimized for the light ray 261 incident at a right angle.

Figure 23A:
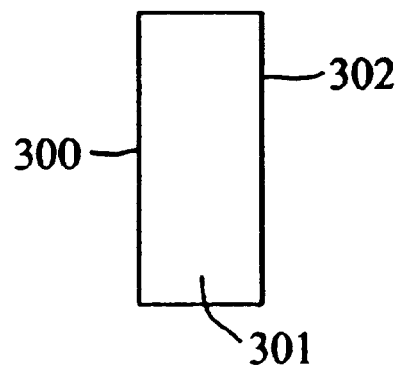
FIGS. 23A through 23C are schematic diagrams each illustrating a transparent substrate with step-shaped elements on at least one surface.
Figure 23B:
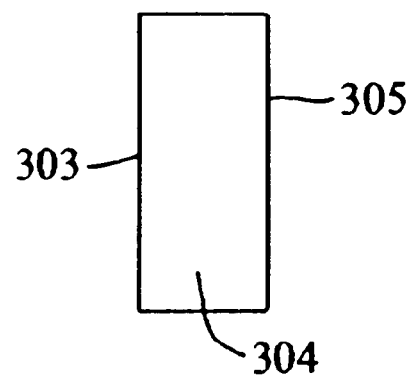
Figure 23C:
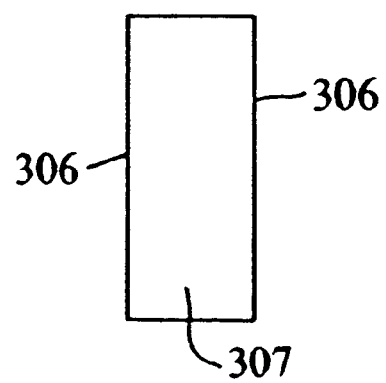

In this embodiment, the optical diffraction device may be formed in various fashions. For example, as shown in FIG. 23A it may be formed in such a manner that the optical diffraction device has a step-structured surface 300 on one side of a transparent substrate 301 and has a flat or spherical surface 302 on the other side, or as shown in FIG. 23B in such a manner that the optical diffraction device has a step-structured surface 303 on one side of a transparent substrate 304 and has an aspheric surface 305 on the other side, or otherwise in such a manner as shown in FIG. 23C that the optical diffraction device has a step-structured surface 306 on both sides of a transparent substrate 307.

Figure 19:
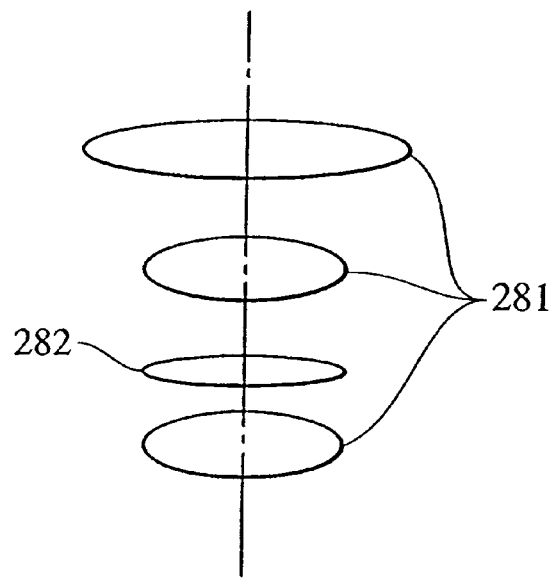
FIG. 19 is a schematic diagram illustrating a projecting optical system.

FIG. 19 is a schematic-diagram illustrating a projecting optical system including an optical diffraction device according to any of the above-described techniques of the invention. In FIG. 19, the projecting optical system consists of spherical or aspheric lenses 281 according to a conventional technique and also an optical diffraction device 282 according to the present invention. The optical diffraction device 282 serves to compensate for various aberrations (chromatic aberration, five Seidel aberrations) of the system in cooperation with the conventional lenses 281. The surfaces of the conventional lenses 281 are coated with an antireflection film.

The projecting optical system according to the present technique may be used in a wide variety of applications including various types of cameras, an interchangeable lens attached to a single-lens reflex camera, business machines such as a copying machine, a projection exposure apparatus used to produce a liquid crystal display panel, and a projection exposure apparatus used to produce a semiconductor chip such as an IC or LSI.

Figure 20:
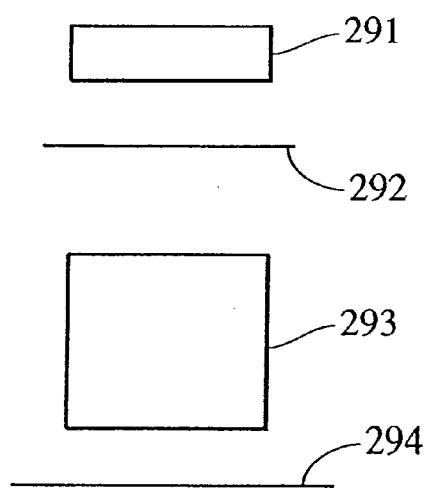
FIG. 20 is a schematic diagram illustrating a projection exposure apparatus.

FIG. 20 is a schematic diagram of a projection exposure apparatus. As shown in FIG. 20, the projection exposure apparatus includes an illumination optical system 291 for supplying an exposure light ray, a mask 292 illuminated by the illumination optical system, an projecting optical system 293 for projecting an image of device pattern formed on the mask 292, and a glass substrate or a silicon substrate 294 coated with a resist. The projecting optical system 293 includes an optical diffraction device according to the present invention. Furthermore, the illumination optical system also includes an optical diffraction device according to the present invention. The lenses in the illumination optical system 291 and the projecting optical system are coated with an antireflection film.

Figure 21:
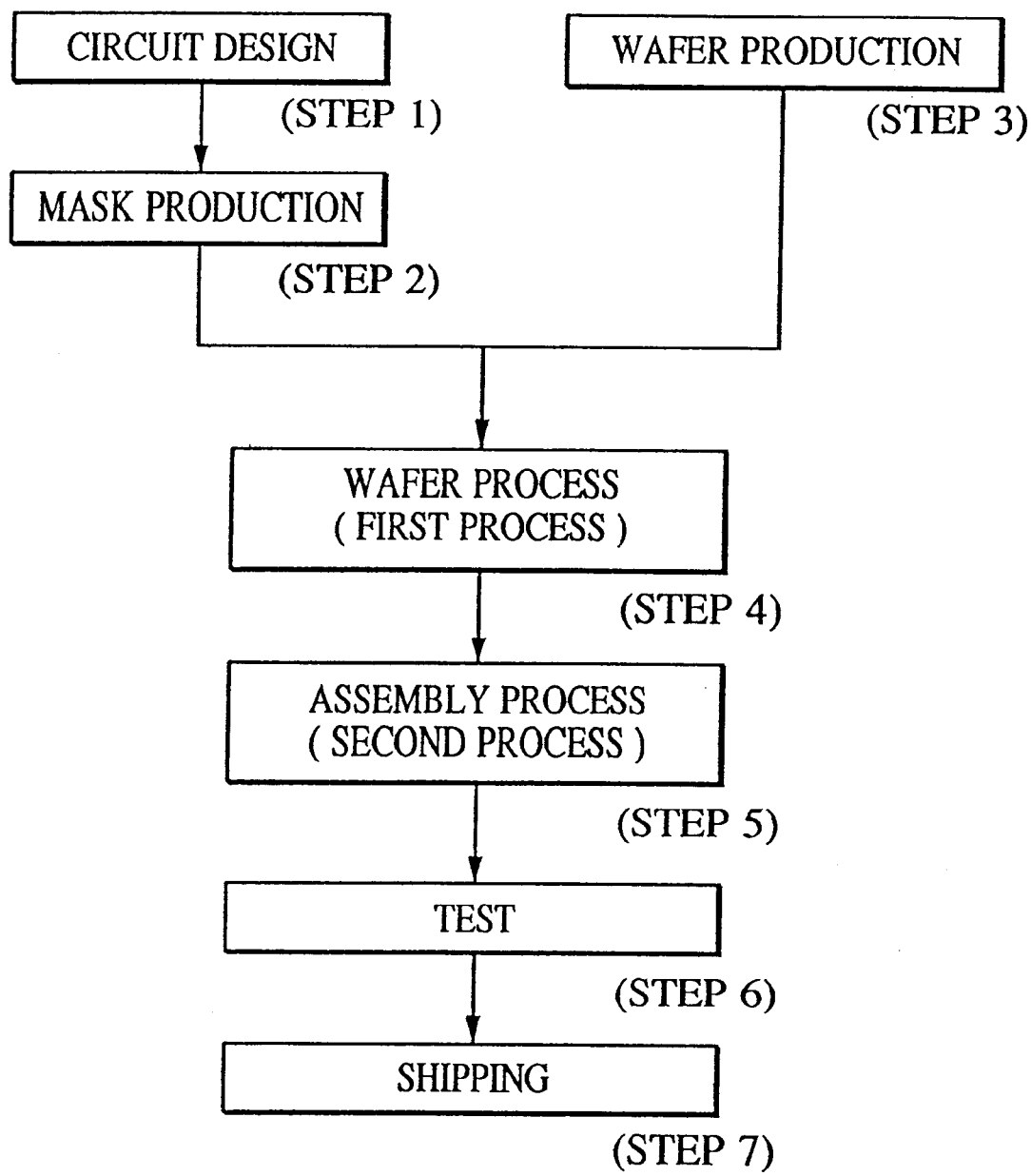
FIG. 21 is a flowchart illustrating the processing steps of producing a semiconductor device.

Now a method of producing a semiconductor device using the projection exposure apparatus according to the present invention will be described below. FIG. 21 is a flowchart illustrating the processing steps of producing a semiconductor device (such as a semiconductor chip for example IC or LSI chip, liquid crystal display panel, CCD). In step 1 (circuit design), a semiconductor device circuit is designed. In step 2 (mask production), masks having circuit patterns corresponding to the circuit designed in step 1 are produced. In step 3 (wafer production), a wafer is produced using a semiconductor material such as silicon. In step 4 (wafer process or often called a first half process), an actual circuit is formed on the wafer by means of the lithography technique using the masks and the wafer produced in the previous steps. In step 5 (assembly or often called a second half process), the wafer on which circuits are formed in step 4 are divided into chips. This step includes the sub steps of assembly (dicing and bonding) and packaging (chip encapsulation). In step 6 (test), the semiconductor devices produced in the previous steps are tested to check whether they operate correctly. The reliability of the devices are also evaluated in step 6. The semiconductor devices which have been completed in these steps are shipped in step 7.

Figure 22:
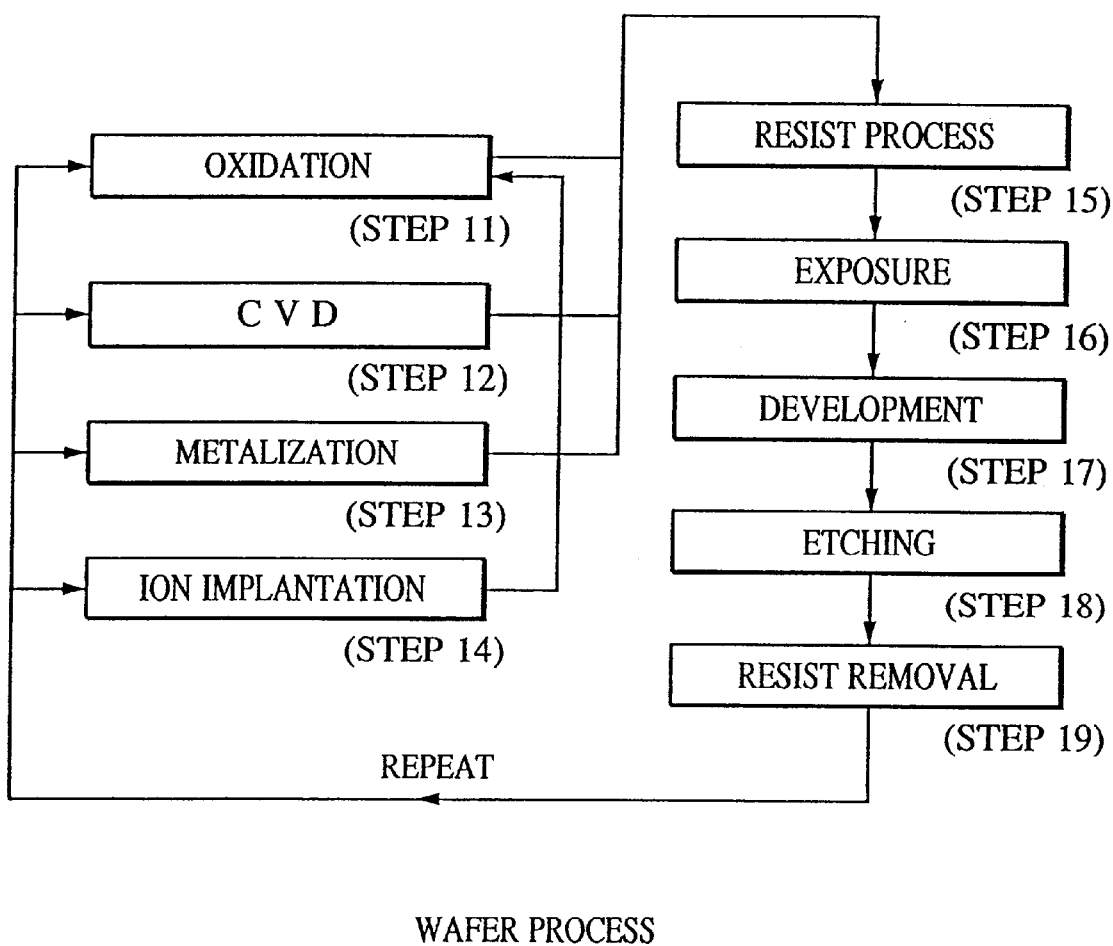
FIG. 22 is a flowchart illustrating the details of the wafer process shown in FIG. 21.

FIG. 22 is a flowchart illustrating the details of the wafer process. In step 11 (oxidation), the surface of the wafer is oxidized. In step 12 (CVD), an insulating film is formed on the surface of the wafer. In step 13 (metalization), electrodes are formed on the surface of the wafer by means of evaporation. In step 14 (ion implantation), ions are implanted into the wafer. In step 15 (resist process), a photosensitive material is coated on the wafer. In step 16 (exposure), the circuit pattern formed on the mask is transferred onto the wafer using the exposure apparatus described above. In step 17 (development), the above wafer is developed. In step 18 (etching), the surface of the wafer is partially removed except the portions covered by the resist pattern developed in the previous step. In step 19 (resist removal), the resist which is no longer necessary after the etching process is removed. The above process is performed repeatedly thereby forming a multilevel circuit pattern on the wafer.

Thus the present embodiment of the invention provides a method of producing a semiconductor device, capable of realizing a semiconductor device with a high integration density which cannot be achieved by the conventional techniques.

What is claimed is:

1. An optical diffraction element comprising a plurality of stair-like constructions each having a plurality of steps, said plurality of stair-like constructions diffracting light and said plurality of steps being formed so that interference among light rays reflected from said plurality of steps causes an overall intensity of the reflected light rays to become substantially zero, wherein said plurality of steps comprises at least three steps, and wherein said plurality of steps are formed so that the following conditions are satisfied:

$$L=1-k+\lambda/\{(n_s-n_i)h\},$$

$$h=\lambda/(2pn_i), \text{ and}$$

$$0<k\leq 1$$

where $\lambda$ is the wavelength of the reflected light rays, $n_s$ is the refractive index of each of said plurality of stair-like constructions, $n_i$ is the refractive index of a medium in contact with a light incident side of said plurality of stair-like constructions, L is the number of steps in each of said stair-like constructions, h is the height of each of said plurality of steps, and p is an integer equal to or greater than 2.

2. An optical diffraction element according to claim 1, wherein each of said plurality of stair-like constructions forms a lens element of a Fresnel lens.

3. An optical diffraction element according to claim 1, wherein said plurality of stair-like constructions are formed on both surfaces of a transparent substrate.

4. An optical diffraction element according to claim 1, wherein said plurality of stair-like constructions are formed on one surface of a transparent substrate, and the other surface of said substrate is formed into an aspheric shape.

5. An optical diffraction element according to claim 1, wherein said plurality of stair-like constructions are formed on one surface of a transparent substrate, and another surface of said substrate is formed into a spherical shape.

6. An optical diffraction element according to claim 1, wherein said plurality of stair-like constructions are made of plastic.

7. An optical diffraction element according to claim 1, wherein said plurality of stair-like constructions are made of glass.

8. An optical diffraction element according to claim 1, wherein said plurality of stair-like constructions form zones of a Fresnel zone plate.

9. An optical diffraction element according to claim 1, wherein said plurality of stair-like constructions are formed so that when light rays incident at a right angle on a surface of each of said plurality of stair-like constructions are reflected from the surface, an overall intensity of reflected light rays becomes substantially zero.

10. An optical diffraction element according to claim 9, wherein said plurality of stair-like constructions have an antireflection film formed thereon, said antireflection film having an antireflection property for light rays incident at a slanted angle on the surface.

11. An optical diffraction element according to claim 1, wherein said plurality of stair-like constructions are formed so that when light rays incident at a slanted angle on a surface of each of said plurality of stair-like constructions are reflected, an overall intensity of the reflected light rays becomes substantially zero.

12. An optical diffraction element according to claim 11, wherein said plurality of stair-like constructions have an antireflection film formed thereon, said antireflection film having an antireflection property for light rays incident at a right angle on the surfaces of each of said plurality of stair-like constructions.

13. An illuminating optical system comprising an optical diffraction element according to any of claims 1 to 12.

14. An exposure apparatus comprising an illuminating optical system according to claim 13, said illuminating optical system serving to illuminate a mask.

15. A method of producing a device, comprising a step of transferring a device pattern formed on a mask onto a substrate using an exposure apparatus according to claim 14.

16. A projecting optical system comprising an optical diffraction element according to any of claims 1 to 12.

17. An exposure apparatus comprising a projecting optical system according to claim 16, said projecting optical system being used to transfer a pattern formed on a mask onto a surface.

18. A method of producing a device, comprising a step of transferring a device pattern formed on a mask onto a substrate using an exposure apparatus according to claim 17.

19. A copying apparatus comprising a projecting optical system according to claim 16.

20. A camera comprising a projecting optical system according to claim 16.

21. An optical diffraction element comprising a plurality of stair-like constructions each having a plurality of steps, said plurality of stair-like constructions diffracting light and said plurality of steps being formed so that interference among light rays reflected from said plurality of steps causes an overall intensity of the reflected light rays to become substantially zero, wherein said plurality of steps comprises at least three steps, and wherein said plurality of steps are formed so that the following conditions are satisfied:

$$L = 1 - k + \lambda / \{(n_s - n_j)h\},$$

$$h = \lambda / (2pn_s), \text{ and}$$

$$0 < k \leq 1$$

where $\lambda$ is the wavelength of the reflected light rays, $n_s$ is the refractive index of each of said plurality of stair-like constructions, $n_j$ is the refractive index of a medium in contact with a light incident side of said plurality of stair-like constructions, L is the number of steps in each of said stair-like constructions, h is the height of each of said plurality of steps, and p is an integer equal to or greater than 2.

22. An optical diffraction element according to claim 21, wherein each of said plurality of stair-like constructions forms a lens element of a Fresnel lens.

23. An optical diffraction element according to claim 21, wherein said plurality of stair-like constructions are formed on both surfaces of a transparent substrate.

24. An optical diffraction element according to claim 21, wherein said plurality of stair-like constructions are formed on one surface of a transparent substrate, and the other surface of said substrate is formed into an aspheric shape.

25. An optical diffraction element according to claim 21, wherein said plurality of stair-like constructions are formed on one surface of a transparent substrate, and another surface of said substrate is formed into a spherical shape.

26. An optical diffraction element according to claim 21, wherein said plurality of stair-like constructions are made of plastic.

27. An optical diffraction element according to claim 21, wherein said plurality of stair-like constructions are made of glass.

28. An optical diffraction,element according to claim 21, wherein said plurality of stair-like constructions form zones of a Fresnel zone plate.

29. An optical diffraction element according to claim 21, wherein said plurality of stair-like constructions are formed so that when light rays incident at a right angle on a surface of each of said plurality of stair-like constructions are reflected from the surface, an overall intensity of reflected light rays becomes substantially zero.

30. An optical diffraction element according to claim 29, wherein said plurality of stair-like constructions have an antireflection film formed thereon, said antireflection film having an antireflection property for light rays incident at a slanted angle on the surface.

31. An optical diffraction element according to claim 21, wherein said plurality of stair-like constructions are formed so that when light rays incident at a slanted angle on a surface of each of said plurality of stair-like constructions are reflected, an overall intensity of the reflected light rays becomes substantially zero.

32. An optical diffraction element according to claim 31, wherein said plurality of stair-like constructions have an antireflection film formed thereon, said antireflection film having an antireflection property for light rays incident at a right angle on the surfaces of each of said plurality of stair-like constructions.

33. An illuminating optical system comprising an optical diffraction element according to any of claims 6–17.

34. An exposure apparatus comprising an illuminating optical system according to claim 33, said illuminating optical system serving to illuminate a mask.

35. A method of producing a device, comprising a step of transferring a device pattern formed on a mask onto a substrate using an exposure apparatus according to claim 34.

36. A projecting optical system comprising an optical diffraction element according to any of claims 6–17.

37. An exposure apparatus comprising a projecting optical system according to claim 36, said projecting optical system being used to transfer a pattern formed on a mask onto a surface.

38. A method of producing a device, comprising a step of transferring a device pattern formed on a mask onto a substrate using an exposure apparatus according to claim 37.

39. A copying apparatus comprising a projecting optical system according to claim 36.

40. A camera comprising a projecting optical system according to claim 36.

* * * * *

UNITED STATES PATENT AND TRADEMARK OFFICE
CERTIFICATE OF CORRECTION

PATENT NO.    : 6,327,086 B1
DATED         : December 4, 2001
INVENTOR(S)   : Yasuyuki Unno It is certified that error appears in the above-identified patent and that said Letters Patent is hereby corrected as shown below:

Column 2,
Line 2, "having." should read -- having --; and

Column 4,
Line 4, "emerge" should read -- emerging --.

Column 6,
Line 21, "n 1.38" should read -- n = 1.38 --.

Column 7,
Line 2, "are" should read -- is --.

Column 9,
Line 11, "Si" should read -- S1 --.

Column 10,
Line 6, "light.rays.($R_2$," should read -- light rays ($R_2$, --.

Column 16,
Line 15, "diffraction,element" should read -- diffraction element --;
Lines 41 and 49, "claims 6-17." should read -- claims 21-32 --.

Signed and Sealed this

Twenty-second Day of July, 2003

JAMES E. ROGAN
*Director of the United States Patent and Trademark Office*